United States Patent [19]

Nishizawa et al.

[11] Patent Number: 5,027,180
[45] Date of Patent: Jun. 25, 1991

[54] DOUBLE GATE STATIC INDUCTION THYRISTOR

[75] Inventors: Jun-ichi Nishizawa, Miyagi; Hisao Kondoh, Osaka, both of Japan

[73] Assignee: Mitsubishi Electric Corporation, Tokyo, Japan

[21] Appl. No.: 423,661

[22] Filed: Oct. 18, 1989

Related U.S. Application Data

[63] Continuation of Ser. No. 132,002, Dec. 11, 1987, abandoned.

[30] Foreign Application Priority Data

Dec. 11, 1986 [JP] Japan .................... 61-295300

[51] Int. Cl.⁵ .................................... H01L 29/74
[52] U.S. Cl. ............................. 357/38; 357/22; 357/39; 357/56
[58] Field of Search ............... 357/22, 38, 39, 56

[56] References Cited

U.S. PATENT DOCUMENTS

| 3,961,354 | 6/1976 | Kuwakata et al. | 357/56 |
|---|---|---|---|
| 4,086,611 | 4/1978 | Nishizawa et al. | 357/56 |
| 4,170,019 | 10/1979 | Hysell et al. | 357/22 E |
| 4,171,995 | 10/1979 | Nishizawa et al. | 357/22 E |
| 4,214,255 | 7/1980 | Neilson | 357/56 |
| 4,216,029 | 8/1980 | Ohki | 357/22 C |
| 4,673,961 | 6/1987 | Nishizawa et al. | 357/56 |
| 4,837,608 | 6/1989 | Nishizawa et al. | 357/56 |

OTHER PUBLICATIONS

IEEE Trans. Electron Devices, vol. ED-22, No. 4, pp. 185-195 (1975).
IEEE Electron Device Letters, vol. EDL-7, No. 3, pp. 175-178 (1986).

Primary Examiner—Rolf Hille
Assistant Examiner—Steven Loke
Attorney, Agent, or Firm—Kerkam, Stowell, Kondracki & Clarke

[57] ABSTRACT

A double gate static induction thyristor comprises a semiconductor substrate, a first gate region formed at a first principal surface of the substrate, and a first semiconductor region of a first conduction type formed on the same first principal surface. A second gate region is formed at a second principal surface of the substrate, and a second semiconductor region of a second conduction type is formed on the same second principal surface. Gate electrodes are formed on the first and second gate regions, and main electrodes are formed on the first and second semiconductor regions, so that portions of the semiconductor regions surrounded by the gate regions form a current path between the main electrodes. Further, impurity is deeply diffused in portions of the first and second gate regions formed with the gate electrodes.

4 Claims, 8 Drawing Sheets

DOUBLE GATE STATIC INDUCTION THYRISTOR

This is a continuation, of application Ser. No. 132,002, filed Dec. 11, 1987, now abandoned.

BACKGROUND OF THE INVENTION

1. Field of the Invention

The present invention relates to a double gate static induction thyristor, and more specifically to a buried-gate type and surface-wiring type double gate static induction thyristor and a manufacturing method therefor.

2. Description of the Related Art

The double gate static induction thyristors have already proposed and examined by various publications such as Japanese patent publication No. Sho 57-004100, U.S. Pat. No. 4,086,611, IEEE Trans. Electron Devices, vol. ED-22, No. 4, pp 185-195 (1975), IEEE Electron Device Letters vol. EDL-7, No. 3, pp. 175-178 (1986), and Japanese Patent Application Laid-open Nos. Sho 61-198776 and Sho 60-208873. This double gate static induction thyristor cannot only switch a large current at a very high speed, but also can be turned off by controlling the voltage of the gate, differently from conventional silicon controlled rectifiers.

FIG. 1 shows a schematic cross-sectional view of a typical example of the double gate static induction thyristors.

The shown thyristor is separated into an upper part and a lower part by a center p-n junction 6. The upper part includes a $p^-$-type semiconductor layer 5 contiguous to an $n^-$-type semiconductor layer 4 of the lower part so as to form the p-n junction 6 therebetween. Another $p^-$-type semiconductor layer 9 is formed on the layer 5, and in addition, $n^+$-type gate regions 7 are formed at a periphery of the layer 5 and also between the layers 5 and 9 in the form of buried regions. An anode electrode 10 is deposited on the second $p^-$-type layer 9. Furthermore, an $n^-$-type semiconductor layer 1 is formed on the $n^-$-type layer 4, and $p^+$-type gate regions 2 are formed at a periphery of the layer 4 and also between the layers 1 and 4 in the form of buried regions. In addition, a cathode electrode 11 is deposited on the second $n^-$-type layer 1, and gate electrodes 12 are deposited on the exposed gate regions 2 and 7.

Incidentally, in this specification and in the attached drawings, "$p^-$" is used to mean that p-type impurities are included or doped at a low concentration, and "$p^+$" is used to mean that p-type impurities are included or doped at a high concentration. Further, "$n^-$" means that n-type impurities are included or doped at a low concentration, and "$n^+$" means that n-type impurities are included or doped at a high concentration.

With the above mentioned arrangement, if the gate electrodes 12 are suitable biased, a current will flow from the anode 10 to the cathode 11 through current paths 8 formed between the gate regions 7 and current paths 3 formed between the gate regions 2, in such a manner that holes are injected from the anode 10 and electrons are injected from the cathode 11.

As can be known from FIG. 1, the conventional double gate static induction thyristor is such that the bottoms of all the $p^+$-type first gate regions 2 facing the p-n junction 6 substantially lie in a single flat plane, i.e., at the same level, and the bottoms of all the $n^+$-type second gate regions 7 facing the p-n junction 6 also substantially lie in another single flat plane, i.e., at the same level.

In order to manufacture such thyristors, the following two methods are widely used.

According to the first manufacturing method, a semiconductor substrate is prepared to constitute the $n^-$-type semiconductor layer 1. Then, the following operations are sequentially performed to the substrate 1: On an upper principal surface, or a first surface, of the $n^-$-type semiconductor substrate 1, the $p^+$-type gate regions 2 are selectively formed; The $n^-$-type semiconductor layer 4 is grown epitaxially on the upper principal surface of the $n^-$-type semiconductor substrate 1 including the surface of the $p^+$-type gate regions 2; The $p^-$-type semiconductor layer 5 is epitaxially grown on the $n^-$-type epitaxial layer 4; The $n^+$-type gate regions 7 are selectively formed on the upper surface of the $p^-$-type epitaxial layer 5; The $p^-$-type semiconductor layer 9 is epitaxially grown on the $p^-$-type epitaxial layer 5 including the surface of the $n^+$-type gate regions 7; The $n^-$-type semiconductor substrate 1 is selectively etched to expose partially the first gate regions 2; The $p^-$-type semiconductor layer 9 is selectively etched to expose partially the second gate regions 7; and the anode electrode 10, the gate electrodes 12 and the cathode electrode 11 are formed on the $p^-$-type epitaxial layer 9, the first and the second gate regions 2 and 7, and the $n^-$-type semiconductor substrate 1, respectively.

According to the other manufacturing method of the conventional double gate static induction thyristor, the $p^-$-type semiconductor lower layer 5 is provided as a substrate. Then, the following operations are sequentially performed to the substrate 5: On a lower principal surface of the $p^-$-type semiconductor substrate 5, the $n^-$-type semiconductor layer 4 is epitaxially grown; On an upper principal surface of the $p^-$-type semiconductor substrate 5, the $n^+$-type gate regions 7 are formed; The $p^-$-type semiconductor layer 9 is epitaxially grown on the substrate 5 including the $n^+$-type second gate region 7; The $p^-$-type gate regions 2 are formed on the lower surface of the $n^-$-type epitaxial layer 4; The $n^-$-type semiconductor lower layer 1 is epitaxially grown on the $n^-$-type epitaxial layer 4; The $n^-$-type semiconductor layer 1 is selectively etched to expose the first gate regions 2; The $p^-$-type semiconductor layer 9 is selectively etched to expose the second gate regions 7; The anode electrode 10, the gate electrodes 12 and the cathode electrode 11 are formed on the $p^-$-type epitaxial layer 9, the first and the second gate regions 2 and 7, and the $n^-$-type epitaxial layer 1, respectively.

In the above mentioned static induction thyristor, as explained hereinbefore, a principal current flows through a principal current path formed between each pair of adjacent gate regions, i.e., through the channel regions 3 and 8. In other words, a current does not flow in the gate regions. Therefore, in order to increase the current capacity of the thyristor, it is very important to make as small as possible the area of the shadow of the gate regions which is projected onto the cathode electrode 10 and the anode electrode 11 of the thyristor.

The static induction thyristor has a blocking characteristics which is greatly dependent upon the interval or space between each pair of adjacent gate regions. Namely, the blocking gain is smaller in a large gate interval portion than in a small gate interval portion. In addition, if the intervals between respective pairs of adjacent gate regions are not equal, the blocking voltage will locally drop. Therefore, the gate region interval should be made as equal as possible.

Furthermore, in the conventional structure of the thyristor as mentioned hereinbefore, if the gate regions are deepened by process of diffusion, the gate regions are laterally extended by lateral diffusion, with the result that the area of the gate regions will inevitably increased. Because of this, the depth of the gate regions is restricted. In the conventional structure, therefore, when the semiconductor regions 1 and 9 are selectively etched, the depth of the etching should be precisely controlled so that the equal depth of etching would be obtained.

For example, in a case that a large power double gate static induction thyristor is manufactured, a so-called pressure constant structure is adopted. In this case, it is necessary to selectively etch the semiconductor regions 1 and 9 having a thickness of 20 to 30 microns, and therefore, a wet etching is adopted for the selective etching. However, an etching speed of the wet etching will extremely vary dependently upon a temperature of an etching liquid. Therefore, it is very difficult to precisely control the depth of the etching, and so, it is difficult to equalize the etching depth. For this reason, in the case that the semiconductor regions are selectively etched, the etching depth becomes uneven because of inequality of the etching speed, so that an impurity concentration of exposed surfaces of the gate regions does not uniform. Thus, a contact resistance between the gate electrodes 12 and the gate regions 2 and 7 will become uneven, so that a gate resistance is increased or a gate resistance distribution becomes uneven. As a result, a thyristor will not operate uniformly as a whole, particularly in the case of a large power element, so that a current capacity of the element will lower.

In order to avoid the above mentioned problem, if the gate regions 2 and 7 are deeply diffused, the gate region area will increase because of a lateral diffusion as mentioned hereinbefore. Therefore, a sectional area of the main current paths or channels is decreased, which also results in decrease of the current capacity.

SUMMARY OF THE INVENTION

Accordingly, it is an object of the present invention is to provide a double gate static induction thyristor which has overcome at least one of the aforementioned drawbacks of the conventional double gate static induction thyristor.

Another object of the present invention is to provide a double gate static induction thyristor having a large current capacity.

Still further object of the present invention is to provide a double gate static induction thyristor having a sufficient sectional area of a main current path or channel and a low gate resistance and uniform gate resistance distribution.

A further object of the present invention is to provide a method of manufacturing a double gate static induction thyristor, which can effectively manufacture the thyristor in accordance with the present invention.

The above and other objects of the present invention are achieved in accordance with the present invention by a double gate static induction thyristor comprising a semiconductor substrate having first and second principal surfaces opposite to each other, a first gate region formed at the first principal surface of the semiconductor substrate, a first semiconductor region of a first conduction type formed on the first principal surface of the semiconductor substrate, a second gate region formed at the second principal surface of the semiconductor substrate, a second semiconductor region of a second conduction type opposite to the first conduction type and formed on the second principal surface of the semiconductor substrate, gate electrodes formed on the first and second gate regions, and main electrodes formed on the first and second semiconductor regions, portions of the semiconductor regions surrounded by the gate region forming a current path between the main electrodes, wherein the improvement is that impurity is deeply diffused in portions of the first and second gate regions formed with the gate electrodes.

Further, in accordance with another aspect of the present invention there is provided a method of manufacturing a double gate static induction thyristor, comprising the step of preparing a semiconductor substrate having first and second principal surfaces opposite to each other; selectively doping impurities of a first conduction type to a portion of the first principal surface of the substrate to be formed with a gate electrode in a subsequent step, so as to form a first gate region having a high impurity concentration and a sufficient depth in a direction perpendicular to the first principal surface; selectively doping impurities of a second conduction type to a portion of the second principal surface of the substrate to be formed with a gate electrode in a subsequent step, so as to form a second gate region having a high impurity concentration and a sufficient depth in a direction perpendicular to the second principal surface; selectively doping impurities of the first conduction type to a portion of the first principal surface of the substrate excluding a portion forming a main current path when the thyristor is completed, so as to form a third gate region having a depth smaller than that of the first gate region; selectively doping impurities of the second conduction type to a portion of the second principal surface of the substrate excluding a portion forming a main current path when the thyristor is completed, so as to form a fourth gate region having a depth smaller than that of the first gate region; depositing a first semiconductor region of the second conduction type having a low impurity concentration on the first principal surface of the substrate; depositing a second semiconductor region of the first conduction type having a low impurity concentration on the second principal surface of the substrate; selectively removing the first semiconductor region to form a mesa-shaped first semiconductor region which at least partially exposes the first gate region at a periphery of the mesa; selectively removing the second semiconductor region to form a mesa-shaped second semiconductor region which at least partially expose the second gate region at a periphery of the mesa; and forming electrodes on exposed surfaces of the first and second gate regions and semiconductor regions.

With the above mentioned structure, the first and second gate regions on which the electrodes are formed have a deep diffusion, and the third and four gate regions provided with no electrode have a shallow diffusion as compared with the first and second gate regions. Therefore, even if the depth of the groove formed to expose the first and second gate regions is uneven, the deep diffusion of the first and second gate regions will ensure that the electrodes is in contact with the exposed first and second gate regions at a low and uniform gate resistance. On the other hand, the third and fourth gate regions having the shallow diffusion will allow a sufficient sectional area of the main current path or channel. Thus, the thyristor can have a large current capacity and a high speed operation.

In addition, in the method as mentioned above, the first and second gate regions and the third and fourth gate regions are respectively formed in separate steps, and therefore, the first and second gate regions can be selectively deepened.

The above and other objects, features and advantages of the present invention will be apparent from the following description of the preferred embodiments of the invention with reference to the accompanying drawings.

DESCRIPTION OF THE PREFERRED EMBODIMENTS

Figure 1:
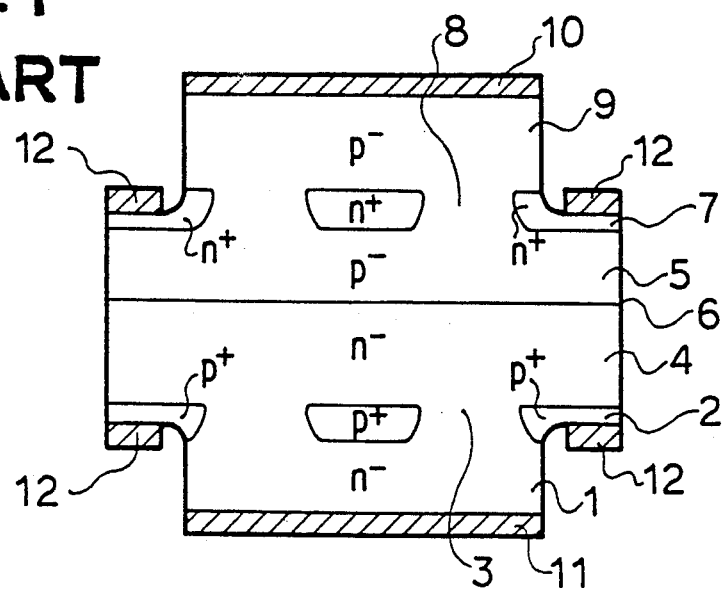
FIG. 1 is a schematic sectional view of a conventional double gate static induction thyristor.
Figure 2:
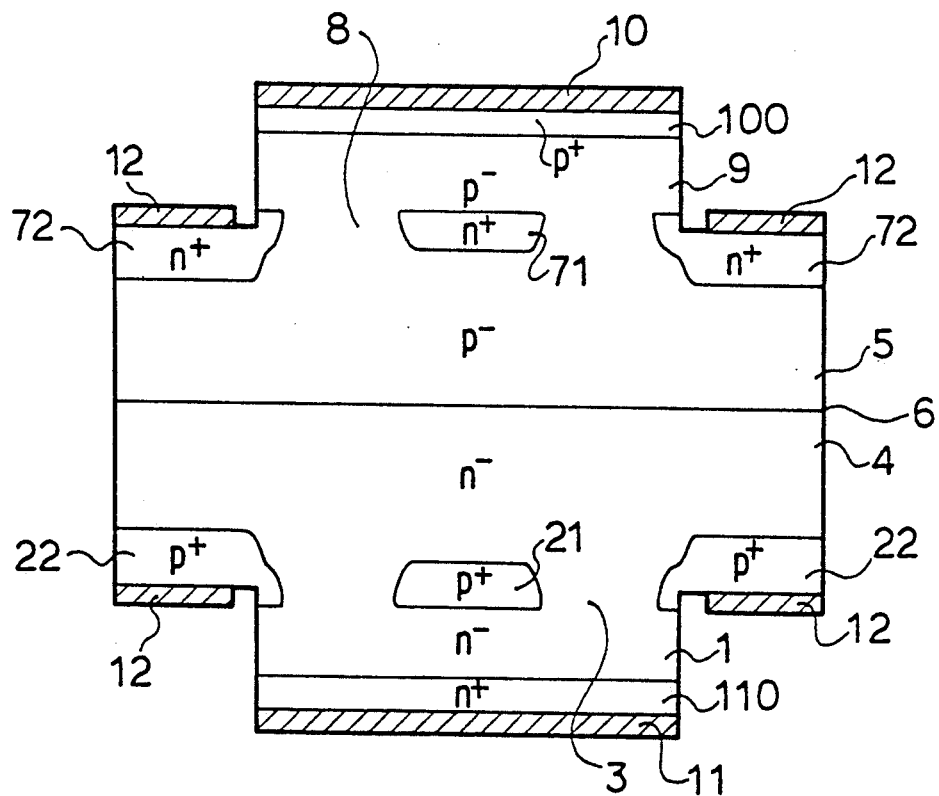
FIG. 2 is a view similar to FIG. 1 but showing a first embodiment of the double gate static induction thyristor in accordance with the present invention.

Referring to FIG. 2, a double gate static induction thyristor in accordance with the present invention includes a semiconductor substrate 4 containing n-type impurities at a low concentration. The substrate 4 has an epitaxial semiconductor layer 5 formed on one principal or upper surface of the substrate to have a low concentration of p-type impurities.

At the other principal or lower surface of the substrate 4 there are selectively formed first gate regions 22 doped with p-type impurities at a high density and having a large diffusion depth, and a third gate region 21 doped with p-type impurities at a high density but having a small diffusion depth. Further, on an upper surface of the epitaxial layer 5 opposite to the substrate 4, there are also selectively formed second gate regions 72 doped with n-type impurities at a high density and having a large diffusion depth, and a fourth gate region 71 doped with n-type impurities at a high density but having a small diffusion depth.

In addition, an epitaxial region 1 containing a low concentration of n-type impurities is formed in a mesa shape on the other principal or lower surface of the substrate 4 excluding the first gate regions 22, and another epitaxial region 9 containing a low concentration of p-type impurities is also formed in a mesa shape on the upper surface of the epitaxial layer 5 excluding the second gate regions 72. These epitaxial regions 9 and 1 respectively have semiconductor contact regions 100 and 110 formed at their top and doped with p-type impurities and n-type impurities at a high concentration, respectively. An anode electrode 10, a cathode electrode 11 and gate electrodes 12 are formed on the contact regions 100 and 110 and exposed surfaces of the first and second gate regions 22 and 72.

Figure 3A:
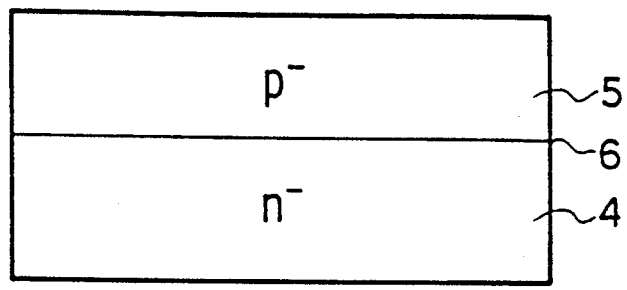
FIGS. 3A to 3Q are schematic sectional views illustrating the manufacturing process in accordance with the present invention.
Figure 3B:
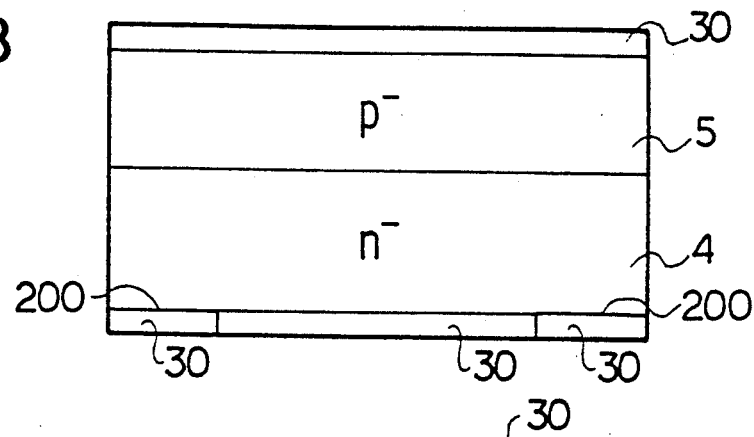
Figure 3C:
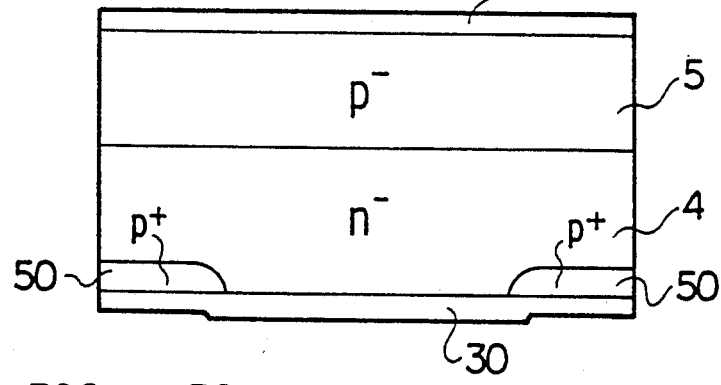
Figure 3D:
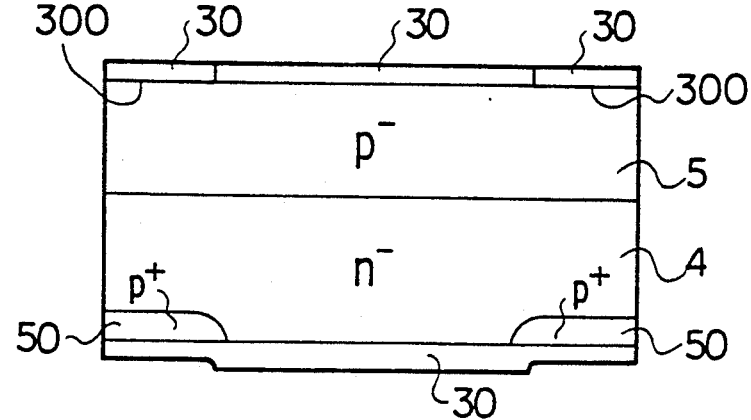
Figure 3E:
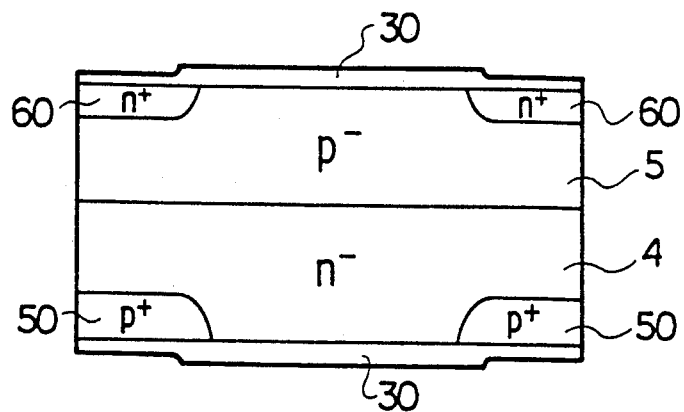
Figure 3F:
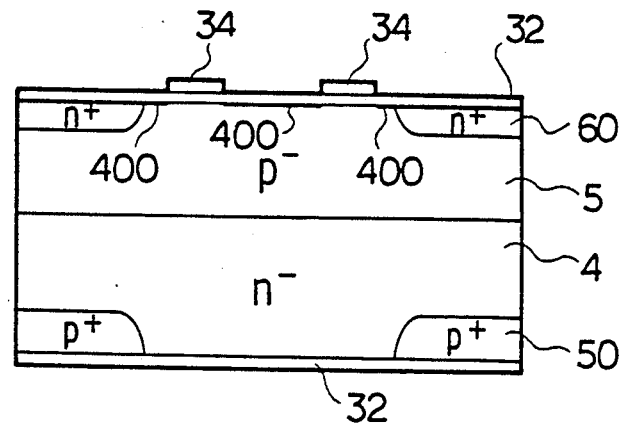
Figure 3G:
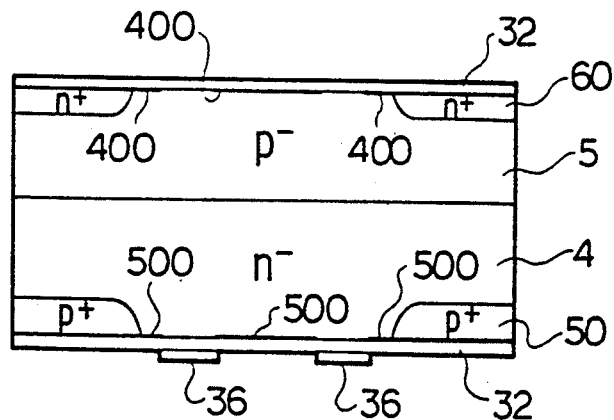
Figure 3H:
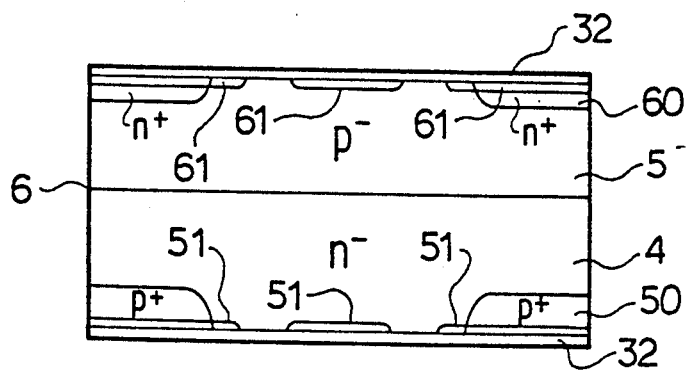
Figure 3I:
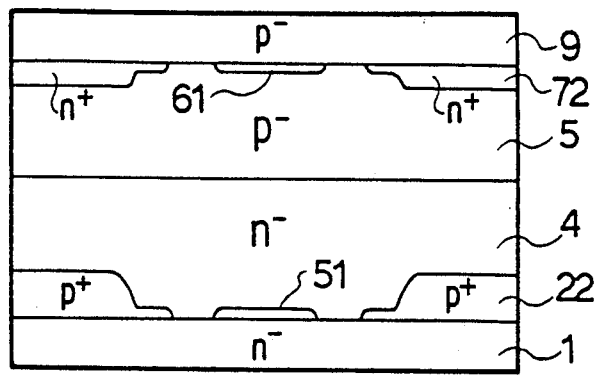
Figure 3J:
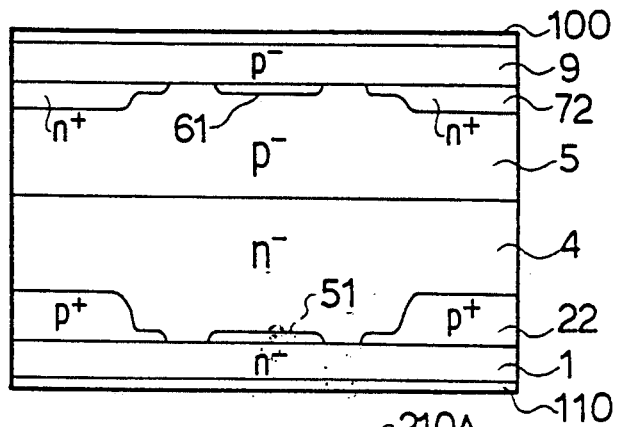
Figure 3K:
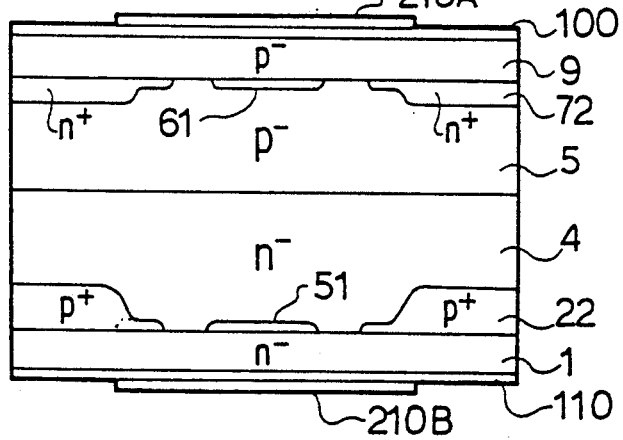
Figure 3L:
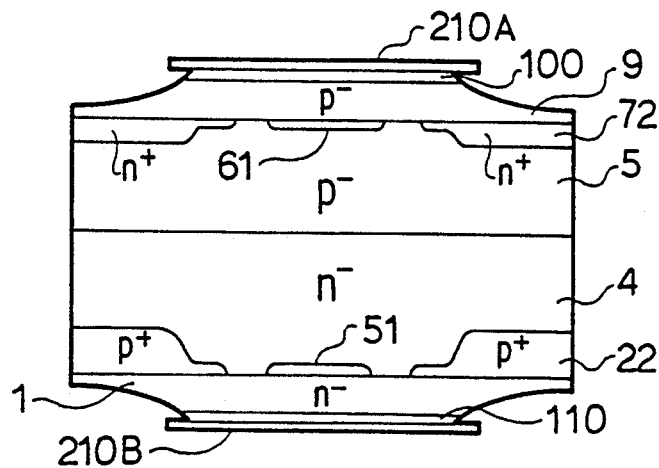
Figure 3M:
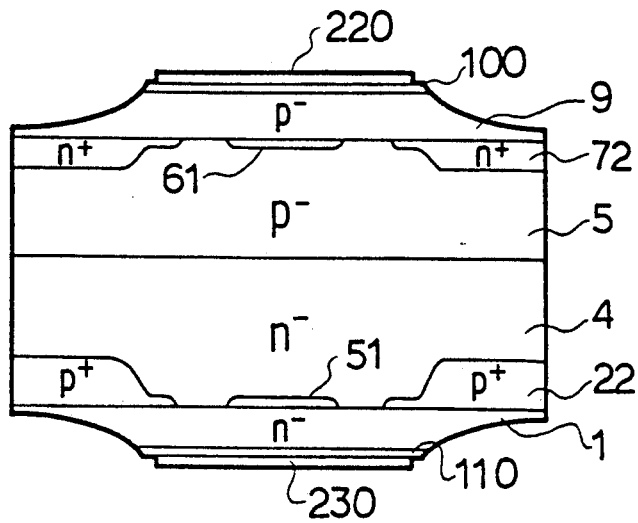
Figure 3N:
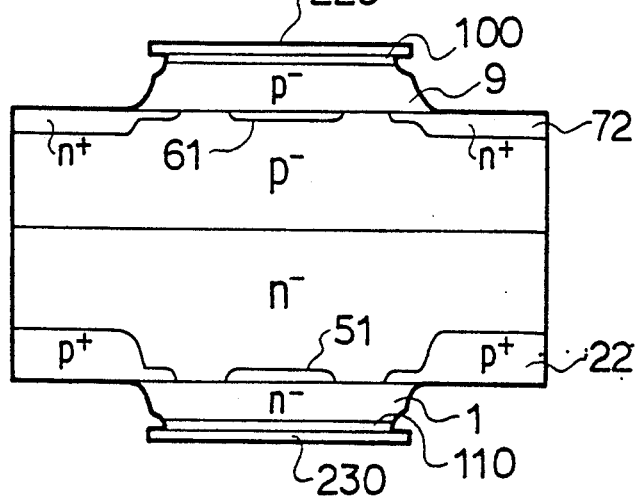
Figure 3O:
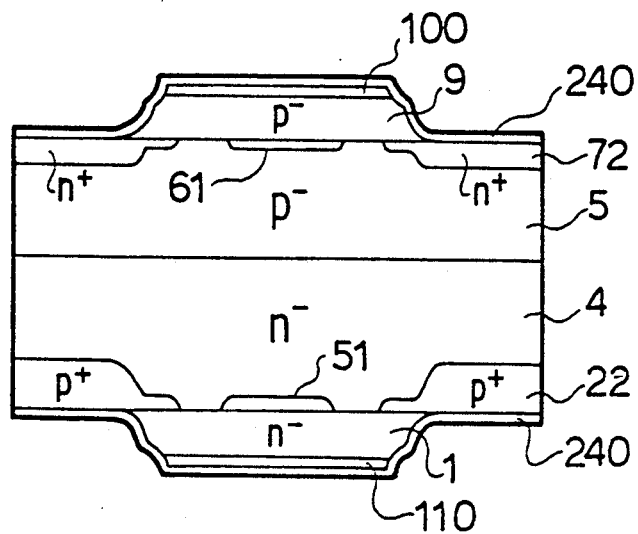
Figure 3P:
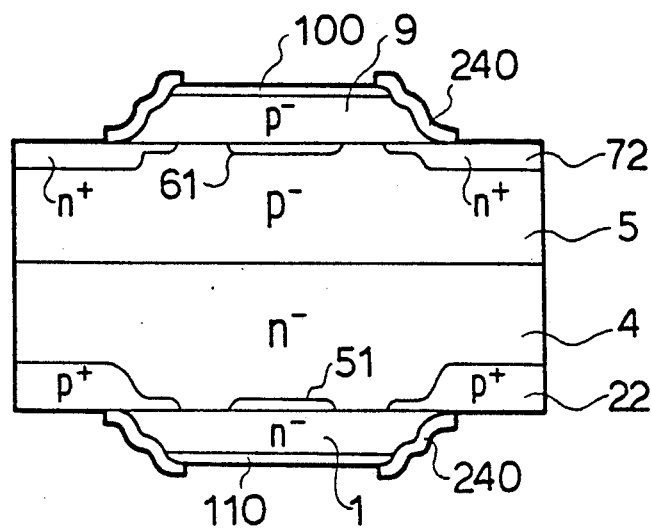
Figure 3Q:
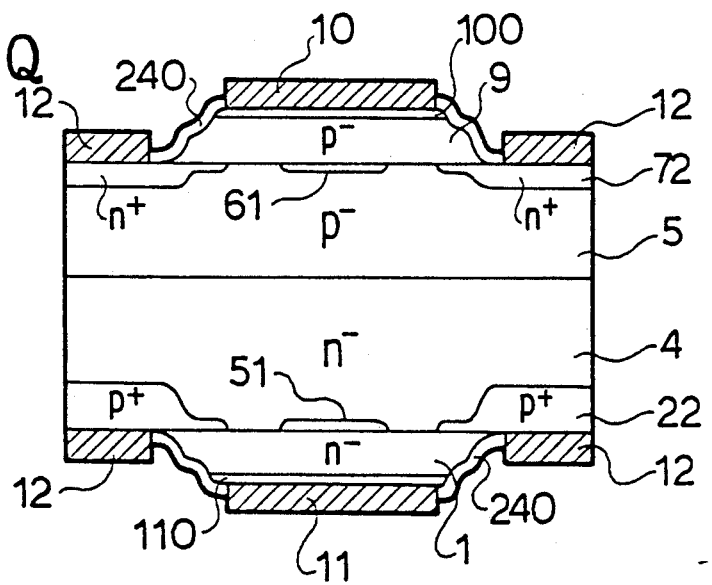

Turning to FIGS. 3A to 3Q, there is illustrated a process for manufacturing the double gate static induction thyristor shown in FIG. 2.

As shown in FIG. 3A, there is prepared a n-type single crystal silicon substrate 4 having a resistivity of 1000 to 2000 ohms-centimeter, a thickness of about 400 microns and a crystal orientation of (111). This substrate has a p-type epitaxial layer 5 deposited on an upper surface thereof. This epitaxial layer 5 has a resistivity of about 50 ohms-centimeter and a thickness of 50 microns.

The substrate thus prepared is oxidized by a thermal oxidation so that a silicon oxide film 30 of about 5000 angstroms is formed on a surface of each of the substrate 4 and the epitaxial layer 5, as shown in FIG. 3B. Then, the silicon oxide film 30 on the substrate 4 is selectively etched by a conventional photolithography, so that there is exposed portions 200 of the silicon substrate surface where a gate electrode is to be formed in a subsequent step. In this etching process, attention should be paid to ensure that the silicon oxide film 30 will not removed from the surface of the epitaxial layer 5.

Then, a p-type impurity is deposited to the exposed silicon surface 200 in accordance with a gas diffusion process. Specifically, $B_2H_6$ is used as a diffusion source; and borons are deposited under a temperature of 950° C. for a period of 30 minutes. After the deposition, an thermal oxidation film is formed again, so that the exposed surface 200 is coated with the thermal oxidation film 30 again, as shown in FIG. 3B.

Thereafter, the substrate is heated at 1215° C. for 24 hours in a nitrogen atmosphere. As a result, borons are diffused into the substrate, so that p+ diffused region 50 are formed at the lower surface of the substrate 4, as shown in FIG. 3C.

Then, as shown in FIG. 3D, the silicon oxide film 30 on the epitaxial layer 5 is selectively etched in a conventional photolithography so as to expose portions 300 of the epitaxial layer surface where a gate electrode is to be formed in a subsequent step. In this etching process, attention should be paid to ensure that the silicon oxide film 30 will not removed from the surface of the substrate 4.

Then, a n-type impurity is deposited to the exposed silicon surface 300 in accordance with a gas diffusion process. Specifically, $POCl_3$ is used as a diffusion source, and phosphorus are deposited under a temperature of 950° C. for a period of 30 minutes. After the deposition, an thermal oxidation film is formed again, so that the exposed surface 300 is coated with the thermal oxidation film 30 again, as shown in FIG. 3D.

Thereafter, the substrate is heated at 1215° C. for 24 hours in a nitrogen atmosphere. As a result, phosphorus are diffused into the substrate, so that n+ diffused regions 60 are formed at the upper surface of the epitaxial layer 5, as shown in FIG. 3E.

Thereafter, all of the silicon oxide film 30 covered on the substrate 4 and the epitaxial layer 5 is removed by etching. Then, a thermal oxidation is carried out again, a fresh thermal oxidation film 32 of 1000 angstrom thickness is formed on the surface of the substrate 4 and the epitaxial layer 5, as shown in FIG. 3F.

Further, a resist pattern 34 is formed on the silicon oxide film 32 covering the epitaxial layer 5. This resist pattern 34 covers channel areas through which a main current flows when the thyristor is completed. Phosphorus ions are implanted into the epitaxial layer 5 by using the resist pattern 34 as a mask. The condition for ion implantation is: acceleration voltage is 130 KV, and ion dose is $5 \times 10^{14}$ to $1 \times 10^{15}$ cm$^{-2}$. As a result, phosphorus is doped at a surface portion 400 of the epitaxial layer 5 which is not covered by the resist pattern 34, as shown in FIG. 3F.

Thereafter, as shown in FIG. 3G, the resist pattern 34 is removed, and then, the substrate is heated in a nitrogen atmosphere at 950° C. for 30 minutes. Further, the substrate is thermally oxidized at 950° C. in a moisturized oxygen atmosphere, so that the silicon oxide film 32 coated on the substrate 4 and the epitaxial layer 5 grows to a thickness of 2000 angstroms.

Then, a resist pattern 36 is formed on the silicon oxide film 32 covering the substrate 4. This resist pattern 36 covers channel areas through which a main current flows when the thyristor is completed. Boron ions are implanted into the substrate 4 by using the resist pattern 36 as a mask. The condition for ion implantation is: acceleration voltage is 80 KV, and ion dose is $5 \times 10^{14}$ to $1 \times 10^{15}$ cm$^{-2}$. As a result, boron is doped at a surface portion 500 of the substrate 4 which is not covered by the resist pattern 36, as shown in FIG. 3G.

Thereafter, the resist pattern 36 is removed, and the substrate is heated in a nitrogen atmosphere at 950° C. for 30 minutes. Further, the substrate is heated at 1180° C. for 30 hours in a nitrogen atmosphere, so that the implanted impurities are diffused to form diffusion regions 51 and 61, respectively, as shown in FIG. 3H. Incidentally, the regions 61 are contiguous to each other in a horizontal plane perpendicular to the sheet surface of the drawing and in parallel to the p-n junction plane 6, and the regions 51 are also contiguous to each other in a horizontal plane perpendicular to the sheet surface of the drawing and in parallel to the p-n junction plane 6. As seen from FIG. 3H, the diffusion regions 50 overlap with some of the diffusion regions 51 so as to form composite diffusion regions, which will be designated by Reference Numeral 22 hereinafter, and the diffusion regions 60 overlap with some of the diffusion regions 61 so as to form composite diffusion regions, which will be designated by Reference Numeral 72 hereinafter. Thus, the diffusion region 51 which does not overlap with the diffusion region 50 constitutes the second gate region 21 having the shallow diffusion shown in FIG. 2, and the diffusion region 61 which does not overlap with the diffusion region 60 constitutes the fourth gate region 71 having the shallow diffusion shown in FIG. 2.

Thereafter, the silicon oxide film 32 is completely removed from the epitaxial layer 5, and a p-type epitaxial layer having a resistivity of 0.36 ohm-centimeter is deposited on an exposed epitaxial layer 5 with a thickness of 2 microns. Further, on the epitaxial layer of 2 micron thickness, there is deposited a p-type epitaxial layer having a resistivity of 20 ohms-centimeter and a thickness of 26 microns. These two deposited layers form an epitaxial layer or region 9. Then, the substrate is thermally oxidized, so that a silicon oxide film of 2000 angstrom thickness is formed on the surface of the epitaxial region 9.

Further, the silicon oxide film is completely removed from the substrate 4, and a n-type epitaxial layer having a resistivity of 0.36 ohm-centimeter is deposited on an exposed substrate 4 with a thickness of 2 microns. Then, on the epitaxial layer of 2 micron thickness, there is deposited a n-type epitaxial layer having a resistivity of 20 ohms-centimeter and a thickness of 26 microns. These two deposited layers form an epitaxial layer or region 1.

Thereafter, all the silicon oxide film on the epitaxial layers 1 and 9 is removed by etching, as shown in FIG. 3I. The deposition of the above mentioned p-type and n-type epitaxial regions 9 and 1 is carried out by an epitaxial growth apparatus of a lamp heating type. Particularly, the relatively low resistivity layers are deposited under a normal pressure, and the relatively high resistivity layers are deposited under a low or reduced pressure.

Then, a silicon oxide film of 5000 angstrom thickness is formed on the epitaxial regions 1 and 9 by use of an ordinary thermal oxidation process. But, a high pressure oxidation process can be used to form an oxide film at a low temperature. Further, all the silicon oxide film is etching-removed from the n-type epitaxial region 1. At this time, attention should be paid to maintain the silicon oxide film on the p-type epitaxial region 9. For this purpose, a dry etching method can be used to etch only the silicon oxide film on the n-type epitaxial region 1. Alternatively, a resist is applied to overcoat the silicon oxide film on the p-type epitaxial region 9, and the silicon oxide film on the n-type epitaxial region 1 is removed by a wet etching.

Thereafter, at the exposed surface of the n-type epitaxial region 1 there is formed a cathode region 110 containing a high concentration of n-type impurities. For example, a gas diffusion process can be used. In this process, POCl$_3$ is used as a diffusion source, and phosphorus is deposited at 950° C. for 30 minutes. Then, the substrate is further heated so that the deposited phosphorus is diffused into the epitaxial region 1 so as to form the high concentration diffusion cathode region 110, while a silicon oxide film of 5000 angstrom thickness is overcoated on the surface of the cathode region 110.

Next, the silicon oxide film is completely etching-removed from the surface of the p-type epitaxial region 9. In this case, attention should be paid to ensure that the silicon oxide film is not removed from the n-type epitaxial layer 1. For this purpose, either of the above mentioned two methods can be used. Then, at the exposed surface of the p-type epitaxial region 9, there is formed an anode region 100 containing a high concentration of p-type impurities. For example, a gas diffusion process is used, in which B$_2$H$_6$ is used as a diffusion source and borons are deposited at 950° C. for 30 minutes. Then, the substrate is heated to cause the deposited boron to diffuse to a depth of 7 microns, and the p-type epitaxial region is overcoated by a silicon oxide film. Thereafter, all the silicon oxide film on the n-type and p-type epitaxial regions 1 and 9 is etching removed, as shown in FIG. 3J.

Then, the substrate is thermally oxidized so that a silicon oxide film of 5000 angstroms thickness is formed on the n-type and p-type epitaxial layers 1 and 9. In this case, it is preferable to use a high pressure oxidation process so as to form the silicon oxide film at a low temperature. On the silicon oxide film formed on the n-type epitaxial region 1, there is formed a resist pattern covering the epitaxial region other than portions to be etching-removed in a subsequent process. By using the resist pattern as a mask, the silicon oxide film is selectively etched from the n-type epitaxial region 1 so that a silicon oxide film pattern 210 B is formed on the region 1, as shown in FIG. 3K. In this process, the silicon oxide film on the p-type epitaxial region 9 should not be etched. For this purpose, one of the following two methods can be used. In a first method, the silicon oxide film on the p-type epitaxial region 9 is completely covered with a resist, and then, the exposed silicon oxide on the n-type epitaxial region 1 is removed by wet-etching. A second method is to use a dry etching so as to selectively etch only the silicon oxide film on the n-type epitaxial region.

After the selective etching of the silicon oxide film on the n-type epitaxial region 1, the remaining resist pattern is removed.

Succeedingly, on the silicon oxide film formed on the p-type epitaxial region 9, there is formed a resist pattern covering the epitaxial region other than portions to be selectively etching-removed in a subsequent process. By using the resist pattern as a mask, the silicon oxide film is selectively etched from the p-type epitaxial region 9 so that a silicon oxide film pattern 210 A is formed on the anode region 9, as shown in FIG. 3K. In this process, the silicon oxide film on the n-type epitaxial region 1 is protected by using one of the above mentioned two methods. Then, the resist pattern remaining on the p-type epitaxial region 9 is removed.

Thereafter, as shown in FIG. 3L, the n-type and p-type epitaxial regions 1 and 9 are selectively etched by using the silicon oxide film patterns 210 A and 210 B as a mask, and by using HF-HNO$_3$ etching liquid. With this etching, the epitaxial regions 1 and 9 are removed by a thickness of 18 microns.

Then, all the silicon oxide film remaining on the n-type and p-type epitaxial regions are etching-removed. Successively, a silicon oxide film of 3000 angstrom thickness is formed on the n-type and p-type epitaxial regions 1 and 9 by a conventional thermal oxidation process. In this case, a high pressure oxidation can be used to form a silicon oxide film at a low temperature.

Furthermore, on the silicon oxide film formed on the n-type epitaxial region 1, there is formed a resist pattern covering the epitaxial region other than portions to be selectively etching-removed in a subsequent process. This resist pattern is smaller than the pattern shown in FIG. 3L. By using the resist pattern as a mask, the silicon oxide film is selectively etched from the n-type epitaxial region 1 so that another silicon oxide film pattern 230 is formed on the region 1, as shown in FIG. 3M. In this process, the silicon oxide film on the p-type epitaxial region 9 is protected by using one of the above mentioned two methods.

Then, after the remaining resist pattern is removed, on the silicon oxide film formed on the p-type epitaxial region 9, there is formed a resist pattern covering the epitaxial region other than portions to be selectively etching-removed in a subsequent process. This resist pattern is smaller than the pattern shown in FIG. 3L. By using the resist pattern as a mask, the silicon oxide film is selectively etched from the p-type epitaxial region 9 so that another silicon oxide film pattern 220 is formed on the region 9, as shown in FIG. 3M. In this process, the silicon oxide film on the n-type epitaxial region 1 is protected by using one of the above mentioned two methods. Then, the resist pattern remaining on the p-type epitaxial region 9 is removed.

Thereafter, the n-type and p-type epitaxial regions 1 and 9 are selectively etched by using the silicon oxide film patterns 220 and 230 as a mask, and by using HF-HNO$_3$ etching liquid. With this etching, the epitaxial regions 1 and 9 are removed by a thickness of 10 microns, as shown in FIG. 3N. Thus, mesa-shaped epitaxial regions 1 and 9 are formed.

Then, all the silicon oxide film remaining on the n-type and p-type epitaxial regions 1 and 9 is removed, and a thermal oxidation process is applied again so as to form a silicon oxide film of 3000 angstrom thickness on each principal surface of the substrate. On the silicon oxide film thus formed, a phosphorus doped silicon oxide film of 3000 angstrom thickness is formed by a chemical vapor deposition. Further, a silicon nitride film of 1000 angstrom thickness is formed on the phosphorus doped silicon oxide film by a low pressure chemical vapor deposition. Thus, a protection coating 240 is formed, as shown in FIG. 3O.

Thereafter, by using a conventional photolithography, a resist pattern is formed on one of the two principal surfaces of the substrate so as to cover other than portions where a contact hole is to be formed in a subsequent process. By using the resist pattern as a mask, the protection coating 240 (silicon oxide film and silicon nitride film) is selectively removed by a dry etching.

After the remaining resist pattern is removed, another resist pattern is formed on the other principal surface of the substrate so as to cover other than portions where a contact hole is to be formed in a subsequent process. By using the resist pattern as a mask, the protection coating 240 (silicon oxide film and silicon nitride film) is selectively removed by a dry etching. Then, the remaining resist pattern is removed. Thus, contact holes are formed in the protection coating 240 as shown in FIG. 3P.

Thereafter, a metal film for electrode is deposited on each principal surface of the substrate, by for example an evaporation or a sputtering. As a metal film for electrode, a single layer metal film such as Al and Al/Si, or a multilayer metal film such as Al-Mo-Ni-An and Ti-Ni-An can be applied. The thickness of the metal film is controlled to be within a range of a few microns to ten microns. Then, the metal film thus formed is patterned by a conventional photolithography to form metal electrodes 10, 11 and 12 as shown in FIG. 3Q. In the photolithography, it is important to ensure that when the metal film on one principal surface of the substrate is etched, the metal film on the other principal surface of the substrate is not subjected to etching. For this purpose, after the metal film on the other principal surface of the substrate is covered with a resist, the metal film on the one principal surface is etched by a conventional wet etching. Alternatively, the etching is carried out by applying an etchant to only the one principal surface of the substrate.

Thus, as shown in FIG. 3Q, there has been completed the double gate static induction thyristor having the anode electrode 10, the cathode electrode 11 and the gate electrodes 12 and having the deep diffusion gate regions and the shallow diffusion gate regions.

Figure 4:
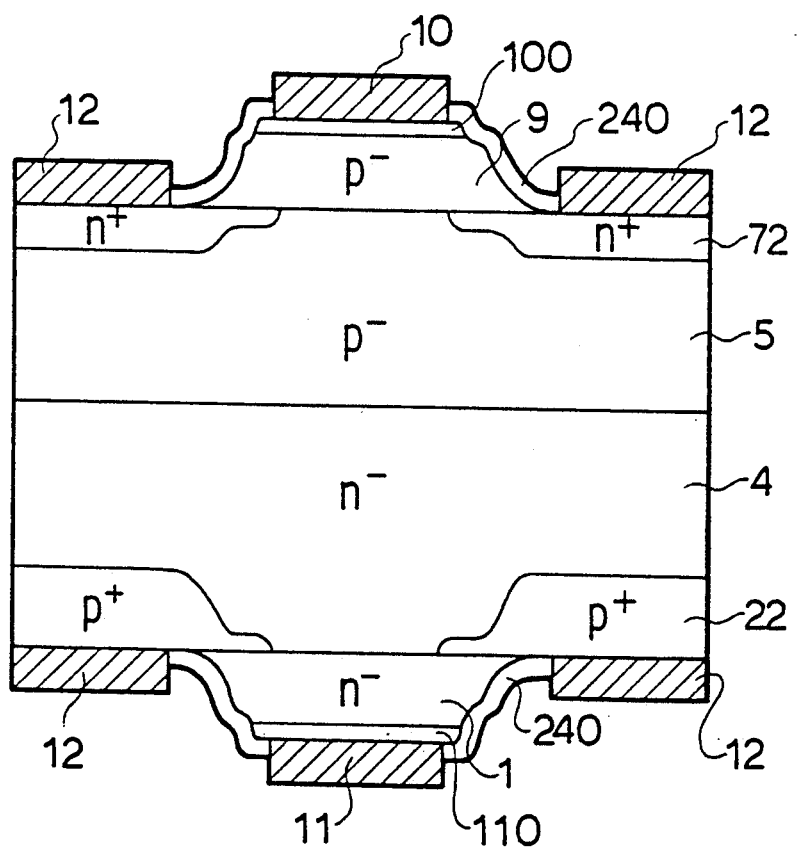
FIG. 4 is a view similar to FIG. 1 but showing a second embodiment of the double gate static induction thyristor in accordance with the present invention.

Turning to FIG. 4, there is shown another embodiment of the double gate static induction thyristor in accordance with the present invention. In FIG. 4, elements and portions similar to those shown in FIG. 2 are given the same Reference Numerals and explanation thereof will be omitted.

As will be apparent from comparison between FIGS. 2 and 4, the thyristor shown in FIG. 4 has no gate region above a center of the cathode electrode 11 and below a center of the anode electrode 10. With this structure, the gate resistance is decreased as compared with the thyristor shown in FIG. 2, so that the switching time can be shortened.

Figure 5:
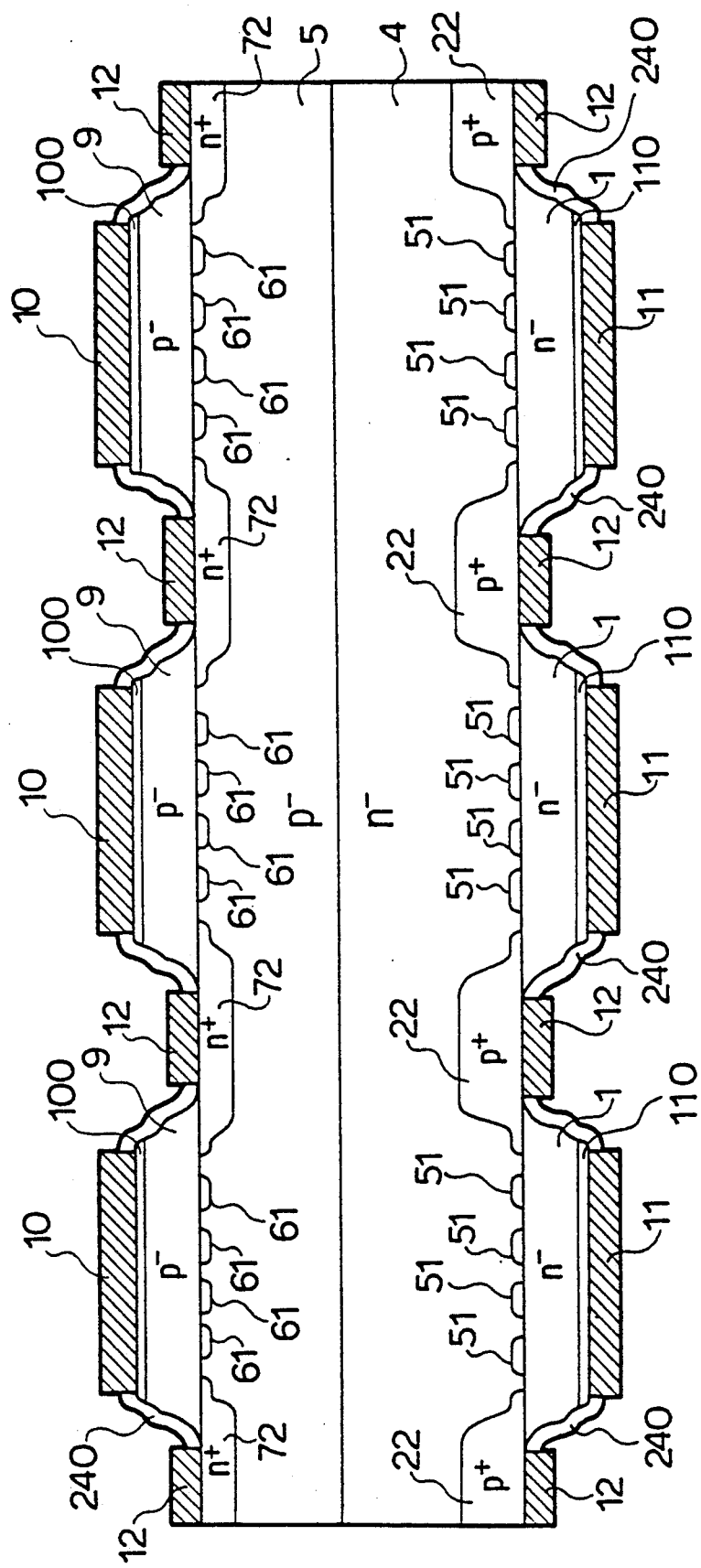
FIG. 5 is a view similar to FIG. 1 but showing a third embodiment of the double gate static induction thyristor in accordance with the present invention.

FIG. 5 illustrates a third embodiment of the double gate static induction thyristor in accordance with the present invention. In FIG. 5, elements and portions similar to those shown in FIG. 2 are given the same Reference Numerals and explanation thereof will be omitted. As seen from FIG. 5, the third embodiment comprises a plurality of thyristor units which are combined integrally and each of which substantially corresponds to the thyristor shown in FIG. 2 except that a plurality of shallow gate regions 51 and 61 are formed above and below each of the cathode and anode electrodes. This thyristor is for a large power.

The invention has thus been shown and described with reference to the specific embodiments. However, it should be noted that the invention is in no way limited to the details of the illustrated structures but changes and modifications may be made within the scope of the appended claims.

We claim:

1. A double gate static induction thyristor comprising a semiconductor substrate having first and second principal surfaces opposite to each other, a first gate region formed at the first principal surface of the semiconductor substrate, a first semiconductor region of a first conduction type formed on the first principal surface of the semiconductor substrate, a second gate region formed at the second principal surface of the semiconductor substrate, a second semiconductor region of a second conduction type opposite to the first conduction type and formed on the second principal surface of the semiconductor substrate, gate electrodes formed on the first and second gate regions, and main electrodes formed on the first and second semiconductor regions, portions of the semiconductor regions surrounded by the gate region forming a current path between the main electrodes, wherein the improvement is that each of the first and second gate regions has a first diffusion region positioned underneath the corresponding gate electrode in ohmic contact with the corresponding gate electrode, and a second diffusion region which extends from the first diffusion region toward a semiconductor region of the semiconductor substrate positioned between the main electrodes, a large part of the second diffusion regions is spaced away from the first diffusion region in a cross-sectional view along the direction of the current flow between said main electrodes, and is electrically connected to the first diffusion region, a diffusion depth of the first diffusion region from the surface in contact with the corresponding gate electrode being larger than that of the second diffusion region from the same level as the surface of the first diffusion region in contact with the corresponding gate electrode.

2. A thyristor as claimed in claim 1 wherein each of the first and second semiconductor regions is in the form of a mesa, and portions of the first and second gate regions exposed at the outside of the mesa-shaped first and second semiconductor regions are formed with the gate electrodes, the other portion of the first gate region being buried at a boundary between the substrate and the first semiconductor region, the other portion of the second gate region being buried at a boundary between the substrate and the second semiconductor region, said other portions of the first and second gate regions being respectively formed of impurity diffused regions having a diffusion depth smaller than that of said portions of the first and second gate regions formed with the gate electrodes.

3. A thyristor as claimed in claim 1 wherein each of the first and second semiconductor regions is in the form of a mesa, and all the first and second gate regions are exposed at the outside of the mesa-shaped first and second semiconductor regions.

4. A thyristor as claimed in claim 1 wherein the substrate includes a first semiconductor layer of the first conduction type and a second semiconductor layer of the second conduction type on the first layer with a p-n junction being formed between the first and second semiconductor layers, the first gate region and the first semiconductor region being formed at the first semiconductor layer, and the second gate region and the second semiconductor region being formed at the second semiconductor layer.

* * * * *